(12) United States Patent
Kim et al.

(10) Patent No.: US 9,402,302 B2
(45) Date of Patent: Jul. 26, 2016

(54) DEVICE FOR IMPROVING ANTENNA RECEIVING SENSITIVITY IN PORTABLE TERMINAL

(71) Applicant: Samsung Electronics Co., Ltd., Gyeonggi-do (KR)

(72) Inventors: Jong-Min Kim, Gyeonggi-do (KR); Tae-Wook Kwon, Gyeonggi-do (KR); Sang-Ho Hong, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 484 days.

(21) Appl. No.: 13/650,834

(22) Filed: Oct. 12, 2012

(65) Prior Publication Data

US 2013/0271942 A1    Oct. 17, 2013

(30) Foreign Application Priority Data

Oct. 14, 2011  (KR) .................... 10-2011-0105475

(51) Int. Cl.
*H05K 1/02*     (2006.01)
*G06F 1/16*    (2006.01)
*H05K 1/18*    (2006.01)

(52) U.S. Cl.
CPC ............ *H05K 1/0218* (2013.01); *G06F 1/1698* (2013.01); *H05K 1/189* (2013.01)

(58) Field of Classification Search
CPC .. H05K 1/0218; H04B 1/3838; H04B 1/3833; H01Q 1/245; G06F 1/1698

USPC ............. 361/679.55, 679.56, 799, 800, 801, 361/816, 818, 825; 174/52, 354, 366, 377, 174/51; 455/575.5, 575.7
See application file for complete search history.

(56) References Cited

U.S. PATENT DOCUMENTS

| | | | |
|---|---|---|---|
| 5,805,251 A * | 9/1998 | Ozawa ........................ 349/110 |
| 6,256,170 B1 * | 7/2001 | Honda ....................... 360/234.5 |
| 8,269,675 B2 * | 9/2012 | Kough et al. ................. 343/702 |
| 8,385,060 B2 * | 2/2013 | Dabov et al. ............... 361/679.3 |
| 8,542,154 B2 * | 9/2013 | You et al. ...................... 343/702 |
| 8,583,187 B2 * | 11/2013 | Kim et al. ..................... 455/566 |
| 8,836,584 B2 * | 9/2014 | Kim et al. ............... 343/700 MS |
| 8,958,855 B2 * | 2/2015 | Shin ..................... H04B 1/3838 455/121 |
| 2002/0135568 A1 | 9/2002 | Chen |
| 2006/0133018 A1 * | 6/2006 | Okuda .......................... 361/681 |
| 2006/0213682 A1 * | 9/2006 | Moon et al. .................. 174/255 |
| 2009/0074255 A1 * | 3/2009 | Holm ........................... 382/115 |

(Continued)

FOREIGN PATENT DOCUMENTS

| | | |
|---|---|---|
| JP | 2005-065145 A | 3/2005 |
| JP | 2006-048166 A | 2/2006 |
| JP | 2010-239211 A | 10/2010 |

(Continued)

*Primary Examiner* — Hoa C Nguyen
*Assistant Examiner* — Christopher L Augustin
(74) *Attorney, Agent, or Firm* — Cha & Reiter, LLC.

(57) ABSTRACT

A device for improving antenna receiving sensitivity in a portable terminal includes an antenna in a low-frequency band of less than 900 MHz which is mounted on a predetermined position in a body housing and a touch pad unit connected to the vicinity of the antenna through a FPCB (Flexible Printed Circuit Board), in which the touch pad unit is grounded to a nearby body in the vicinity of the touch pad unit by using a conductive portion to block noise generated in the touch pad unit, thereby improving the antenna receiving sensitivity.

17 Claims, 9 Drawing Sheets

(56) References Cited

U.S. PATENT DOCUMENTS

2011/0169743 A1* 7/2011 Oh et al. .................... 345/169
2011/0210929 A1* 9/2011 Hiranobu .................. 345/173

FOREIGN PATENT DOCUMENTS

| KR | 10-2006-0017231 A | 2/2006 |
| WO | 2010-021357 A1 | 2/2010 |

* cited by examiner

DEVICE FOR IMPROVING ANTENNA RECEIVING SENSITIVITY IN PORTABLE TERMINAL

CLAIM OF PRIORITY

This application claims the benefit under 35 U.S.C. §119 (a) of a Korean Patent Application filed in the Korean Intellectual Property Office on Oct. 14, 2011 and assigned Serial No. 10-2011-0105475, the entire disclosure of which is hereby incorporated by reference.

BACKGROUND OF THE INVENTION

1. Field of the Invention

The present invention generally relates to a portable terminal including a smart phone, a tablet Personal Computer (PC), etc., and more particularly, to a device for improving the receiving sensitivity of a Long Term Evolution (LTE) antenna operating in an LTE band of low frequencies of 900 MHz or less.

2. Description of the Related Art

Portable terminals generally refer to information devices such as cellular phones, note books, smart phones, tablet Personal Computers (PCs), Personal Digital Assistants (PDAs), etc. In current multimedia environments, the growths of users of smart phones or tablet PCs are increasing due to convenient User Interface (UI) environments. The smart phone or the tablet PC provides not only general voice and text communications, but also various functions such as Internet, video streaming, personal schedule management, games, and so forth.

Figure 1:
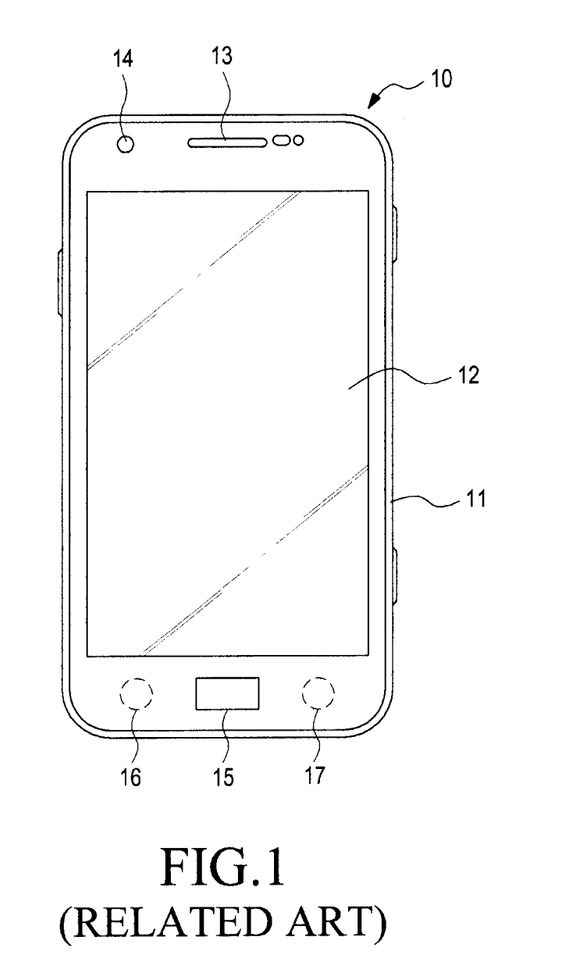
FIG. 1 is a front view of a portable terminal according to prior art.

An exemplary smart phone 10 is shown in FIG. 1. As shown, a body housing 11 of the smart phone 10 includes a touch screen 12 on a front surface thereof, a camera 14 and a receiver 13 on an upper end portion thereof, and an on/off key 15 on a lower end portion thereof. At left and right sides with respect to the on/off key 15 are disposed a first touch area 16 and a second touch area 17. The first touch area 16 at the left side is a touch key for executing various particular functions, and the second touch area 17 at the right side is a touch key for executing a back function.

Figure 2:
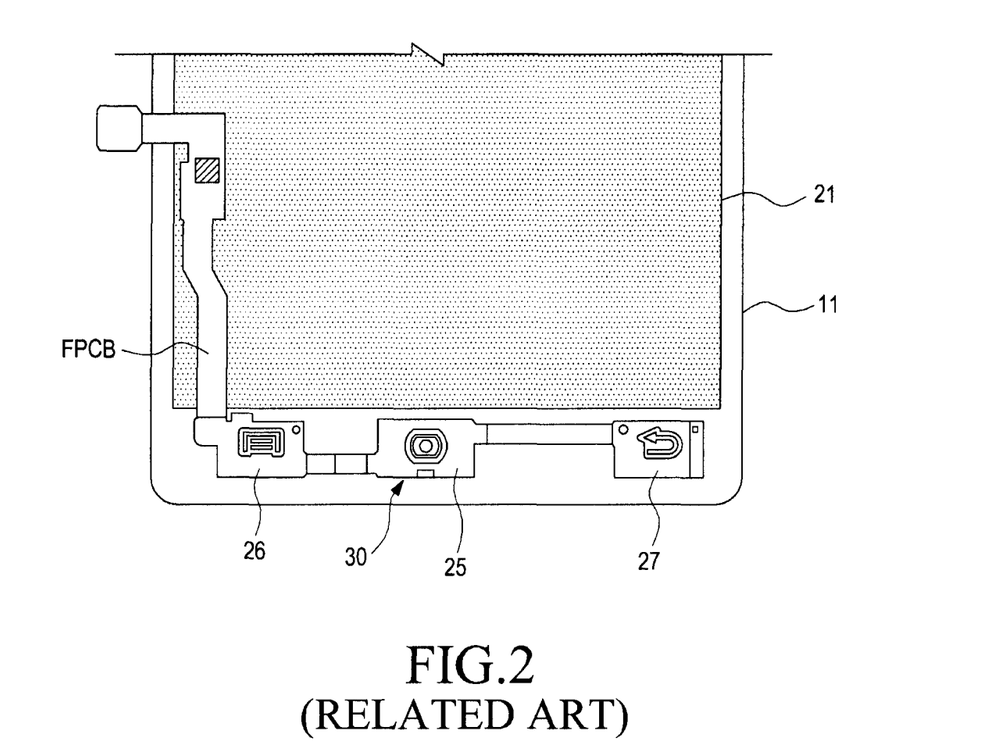
FIG. 2 is a front view showing a state where a conventional touch pad unit is installed on a body housing.

Referring to FIG. 2, a portable terminal/smart phone (10) has a display bracket 21 coupled in the body housing (11) thereof, and further includes a display device, various components, and a main Printed Circuit Board (PCB) (not shown) on top and bottom surfaces of the display bracket 21. First and second touch pads 26 and 27 and an on/off switch 25, which form a touch pad unit (30) disposed at an inner lower end of the body housing 11, are connected to the main PCB (not shown) through a Flexible PCB (FPCB).

Figure 3:
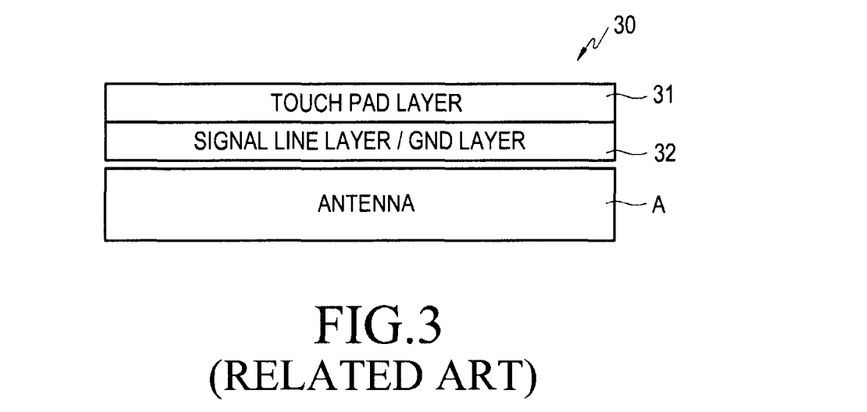
FIG. 3 is a cross-sectional view showing a conventional touch pad unit.
Figure 4:
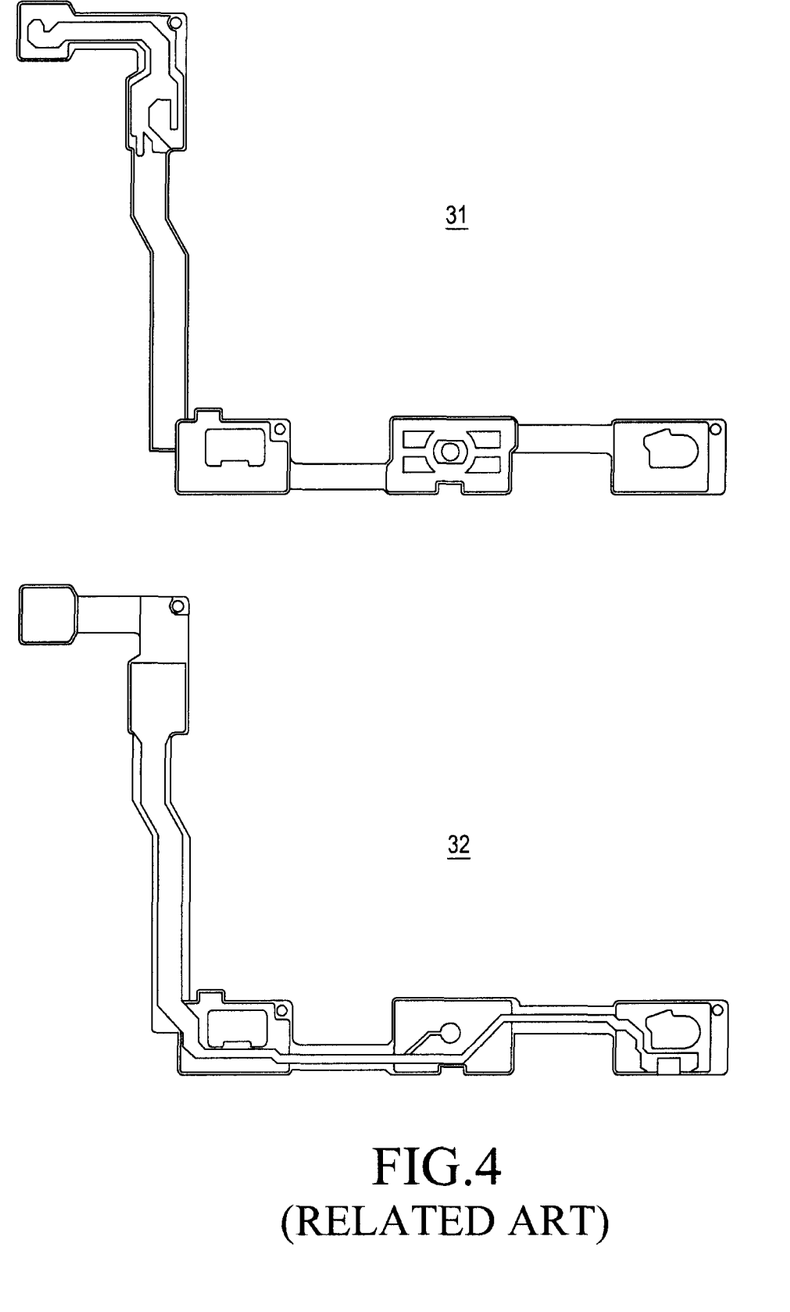
FIG. 4 is a front view showing a touch pad layer and a signal line layer/ground layer forming a conventional touch pad unit.

As shown in FIGS. 3 and 4, as can be seen from a cross section of the touch pad unit (30), the touch pad unit (30) is formed of a touch pad layer 31 and a signal line layer/ground layer 32, i.e., as a two-layer thin structure in which upper and lower layers are attached to each other and stacked. The touch pad unit (30) is structure such that a Long Term Evolution (LTE) antenna A is disposed close to a bottom surface of the touch pad unit (30) and an LTE antenna feeding unit is disposed in the touch pad unit (30).

Figure 5:
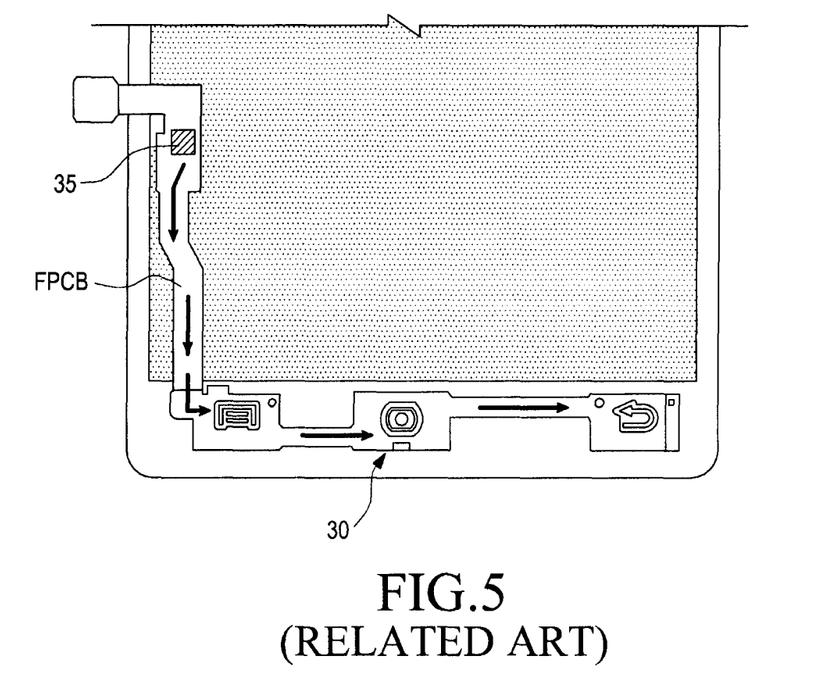
FIG. 5 is a front view showing a direction in which low-frequency noise is delivered to a conventional touch pad unit.
Figure 6:
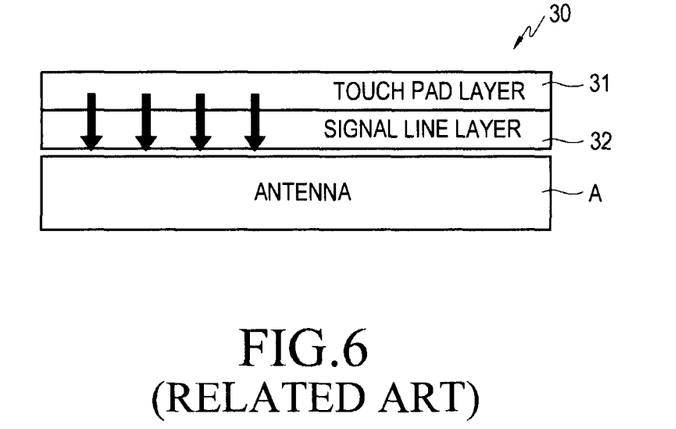
FIG. 6 is a cross-sectional view showing a state where low-frequency noise is delivered to an antenna from a conventional touch pad unit.

However, as shown in FIGS. 5 and 6, when a display device of a smart phone is in an on state, the touch pad unit 30 is operational at all times for sensing user's key input. As a result, low-frequency noise of an internal clock generated in a touch Integrated Circuit (IC) 35 included in the touch pad unit 30 leaks to outside through the touch pad unit 30, thus introducing the low-frequency noise to the antenna A. The arrows shown in FIGS. 5 and 6 represent directions in which the harmonic (low-frequency) noise generated in the touch IC 35 is delivered and leaks to the antenna A.

In particular, when an LTE Radio Frequency (RF) signal receives an RF signal in a low-frequency band such as 5 Band (869 MHz through 894 MHz), it is affected by noise of 24 MHz, thus lowering a receiving (RX) sensitivity level. The noise frequency band generated in the touch IC 35 is approximately 888 MHz (24 MHz×37), and the 5 Band LTE RX antenna band is approximately between 869 MHz and 894 MHz, thereby deteriorating the LTE antenna receiving sensitivity.

SUMMARY OF THE INVENTION

Accordingly, an aspect of the present invention is to provide a device for improving antenna receiving sensitivity by grounding a touch pad unit, which is in the vicinity of an antenna, to a nearby body to optimize a function of the antenna.

Another aspect of the present invention is to provide a device for improving the LTE signal receiving sensitivity of an antenna while blocking noise of an internal clock generated in a touch IC which leaks from a touch pad.

According to an aspect of the present invention, a device for improving antenna receiving sensitivity in a portable terminal includes an antenna, a touch pad unit disposed in the vicinity of the antenna, a display bracket on which the touch pad unit is disposed, and a conductive portion disposed between the display bracket and the touch pad unit to connect noise introduced from the touch pad unit toward the display bracket which in turn blocks the noise introduction to the antenna.

According to another aspect of the present invention, a device for improving antenna receiving sensitivity in a portable terminal includes a touch pad unit and a low-frequency band antenna disposed in the vicinity of the touch pad unit, in which the touch pad unit includes a touch pad layer, a signal line layer attached to a bottom surface of the touch pad layer, and a first ground layer attached to a bottom surface of the signal line layer, in which the first ground layer absorbs noise introduced from the touch pad unit to block the noise introduction to the antenna, thereby improving the antenna receiving sensitivity.

According to another aspect of the present invention, a device for improving antenna receiving sensitivity in a portable terminal includes an antenna in a low-frequency band of less than 900 MHz, which is mounted on a predetermined position in a body housing and a touch pad unit connected to the vicinity of the antenna through a FPCB (Flexible Printed Circuit Board), in which the touch pad unit is grounded to a nearby body in the vicinity of the touch pad unit by using a conductive portion to block noise generated in the touch pad unit, thereby improving the antenna receiving sensitivity.

BRIEF DESCRIPTION OF THE DRAWINGS

The above and other features and advantages of exemplary embodiments of the present invention will be more apparent from the following detailed description taken in conjunction with the accompanying drawings, in which.

DETAILED DESCRIPTION OF THE EXEMPLARY EMBODIMENTS

Hereinafter, an exemplary embodiment of the present invention will be described in detail with reference to the accompanying drawings. Throughout the drawings, like reference numerals refer to like components.

Figure 7:
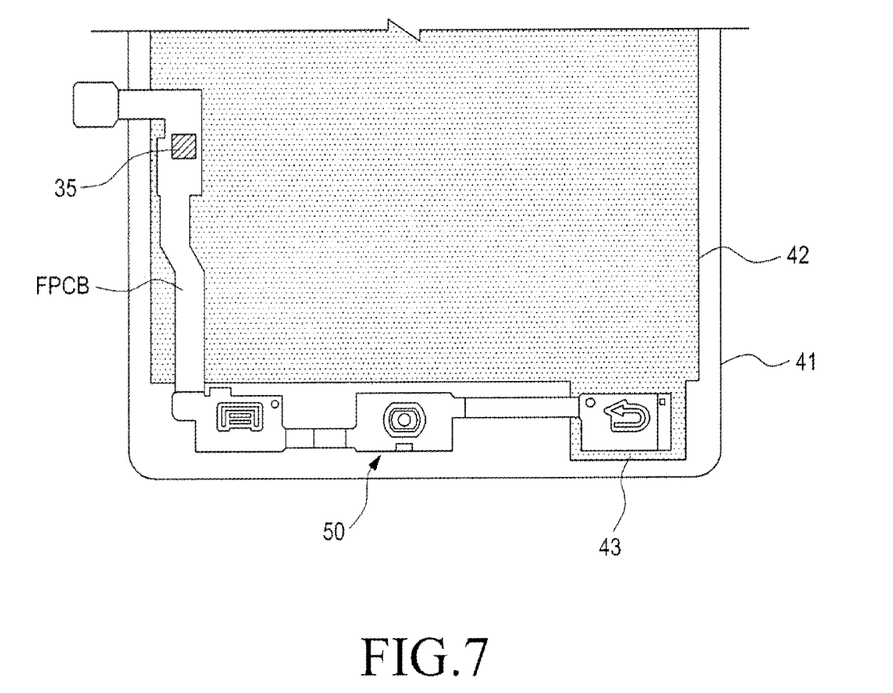
FIG. 7 is a front view of a device according to the present invention.
Figure 8:
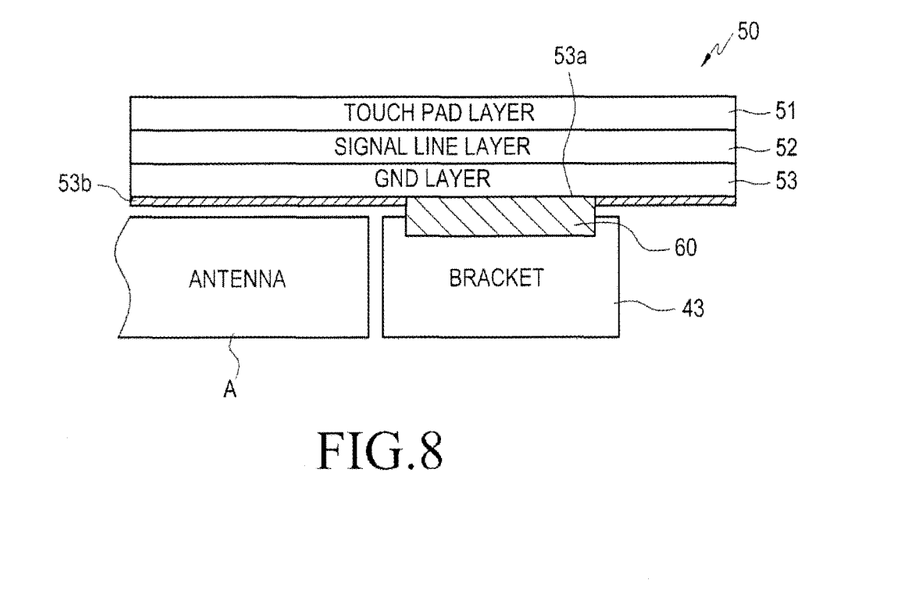
FIG. 8 is a cross-sectional view of a device according to the present invention.

Referring to FIGS. 7 and 8, a device for improving antenna receiving sensitivity according to the present invention improves the receiving sensitivity of a Long Term Evolution (LTE) antenna used in a body housing 41 of a smart phone as an example of a portable terminal According to the teachings of the present invention the antenna receiving sensitivity is improved by blocking noise in a low-frequency band of less than 900 MHz. The device grounds a touch pad unit 50, connected to a flexible circuit, which is in the vicinity of an antenna A included in the body housing 41, to a nearby body, thereby improving the receiving sensitivity of the antenna A. The nearby body is preferably a display bracket 42 formed of a magnesium (Mg) alloy material.

As shown, the device includes the touch pad unit 50, the antenna A, the display bracket 42, an extension portion 43, and a conductive portion 60. The antenna A is an LTE antenna in which an antenna reception signal receives signals in a low-frequency band such as 5 Band of 869 MHz through 894 MHz. The touch pad unit 50 may be a touch pad unit disposed in the vicinity of the LTE antenna A among a plurality of touch pad units used in the smart phone, or a touch pad unit provided with a connection path by the LTE antenna A and a Flexible Printed Circuit Board (FPCB).

Figure 11:
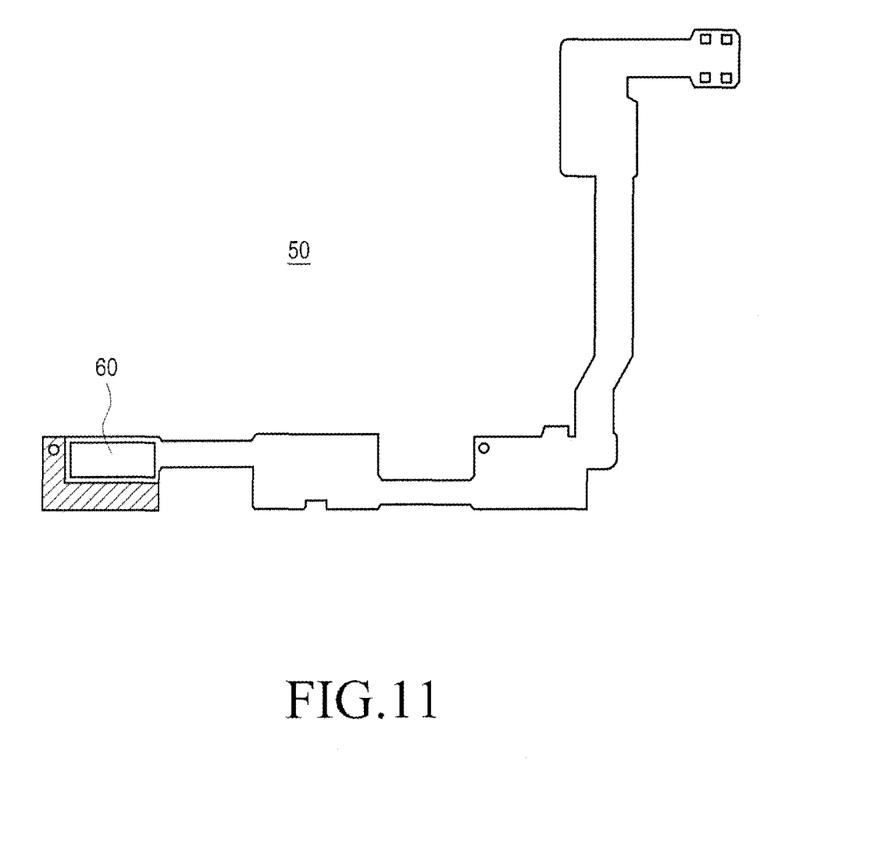
FIG. 11 is a front view of a substantial display bracket according to the present invention.

The display bracket 42 is formed of a lightweight and rigid Mg alloy material, and is coupled to the body housing 41 by forced insertion. The display bracket 42 has a display device and a camera lens module (not shown) disposed on a top surface thereof and has a main PCB and various circuit components connected to the main PCB disposed on a bottom surface thereof. The display bracket 42 is in a substantially flat shape and is coupled to the body housing 41 in a forced insertion manner by means of an engagement structure. The engagement structure may be, for example, a hook. The substantial shape of the display bracket 42 is shown in FIG. 7. The display bracket 41 includes the extension portion 43 for grounding by being conductive with the touch pad unit 50. The extension portion 43 extends in parallel from the display bracket 42 in an integrated form. The substantial shape of the extension portion (43) is shown in FIG. 11.

The conductive portion 60 electrically connects the display bracket (42), more specifically, the extension portion 43, with the touch pad unit 50, and may be formed of a conductive double-side tape. That is, a surface of the conductive portion 60 is attached to and conductive with the touch pad unit 50, and the other surface of the conductive portion 60 is attached to and conductive with the extension portion 43.

Figure 10A:
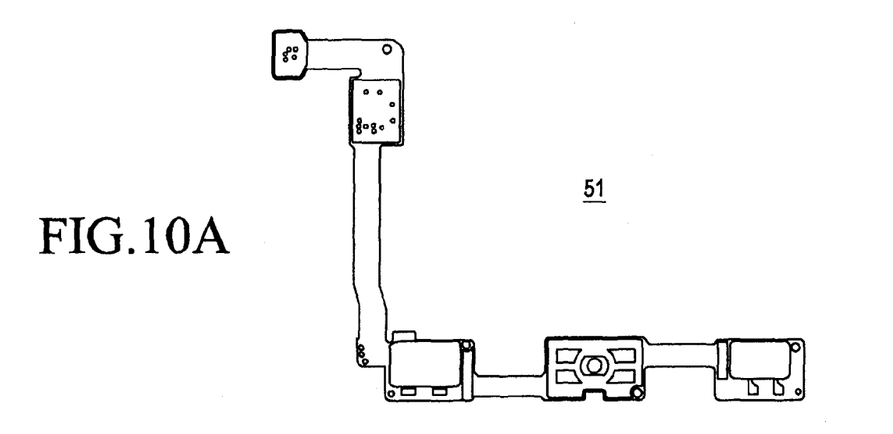
FIGS. 10A through 10C are front views sequentially showing a touch pad layer, a signal line layer, and a first ground layer which form a touch pad unit according to the present invention, respectively.
Figure 10B:
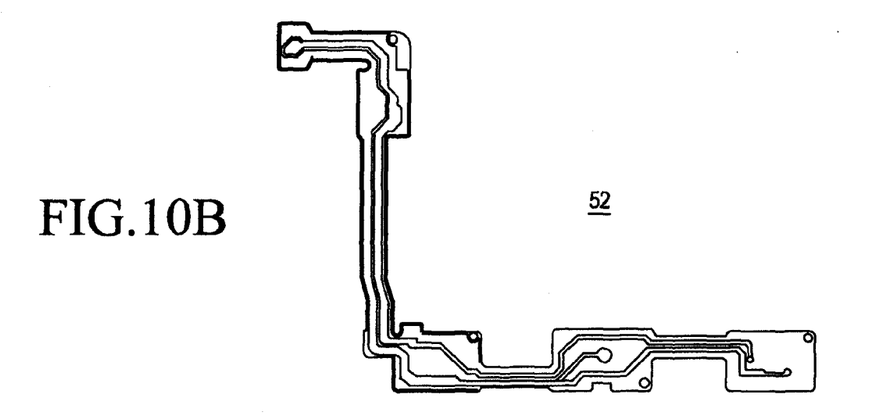
Figure 10C:
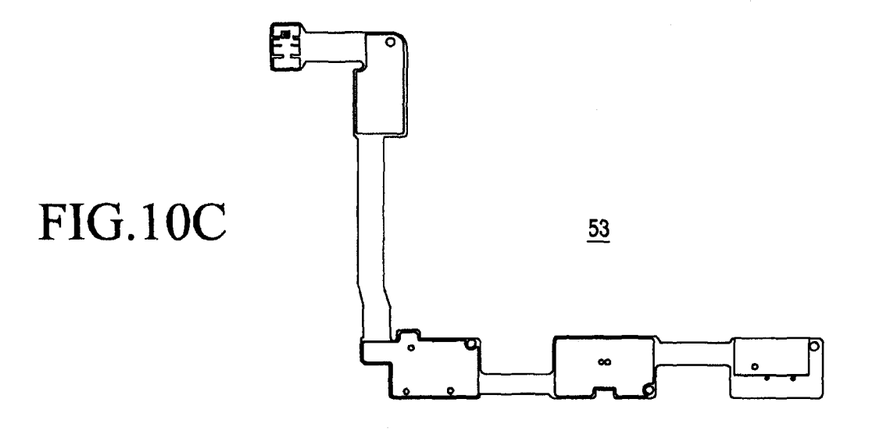

The touch pad unit 50 is modified from a conventional 2-layer structure to a 3-layer structure, such that the touch pad unit 50 includes a touch pad layer 51, a signal line layer 52, and a first ground layer 53. The signal line layer 52 is disposed on the bottom surface of the touch pad layer 51. The first ground layer 53 is disposed on the bottom surface of the signal line layer 52. The signal line layer 52 may include a second ground layer. In FIG. 8, the signal line layer 52 is disposed between the touch pad layer 51 and the first ground layer 53. FIGS. 10A through 10C show the substantial touch pad layer 51, signal line layer 52, and first ground layer 53, respectively. In FIG. 10B, a black area expresses the second ground layer.

Figure 12:
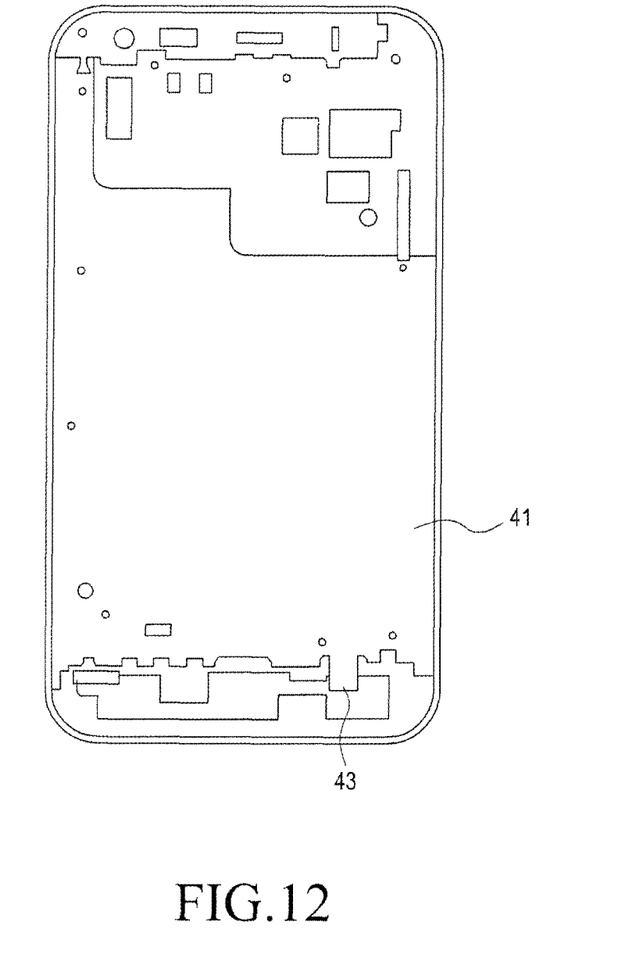
FIG. 12 is a rear view of a touch pad unit according to the present invention.

The first ground layer 53 is formed of a metallic material, and in particular, may be a thin-type metallic plate, such that the first ground layer 53 is attached to and conductive with the display bracket (42), more specifically, the extension portion 43, by means of the conductive portion 60. The first ground layer 53 includes a first area 53a which is an open and exposed partial area of the bottom surface of the first ground layer 53, i.e., which has attached the conductive portion 60 thereto and thus is conductive in a surface-contact manner, and includes a second area 53b which does not have the conductive portion 60 attached thereto. The second area 53b includes a non-conductive layer made of a Solder Resist (SR) material. The first area 53a is structured such that a portion of the first ground layer (53) is exposed by removing the non-conductive layer. Alternatively, the first ground layer 53 may be structured such that by removing the non-conductive layer, the entire bottom surface of the first ground layer 53 has the conductive portion 60 attached thereto and thus is conductive with the extension portion 43. In FIG. 12, the conductive portion 60 is attached to the first area 53a on the bottom surface of the first ground layer 53.

Figure 9:
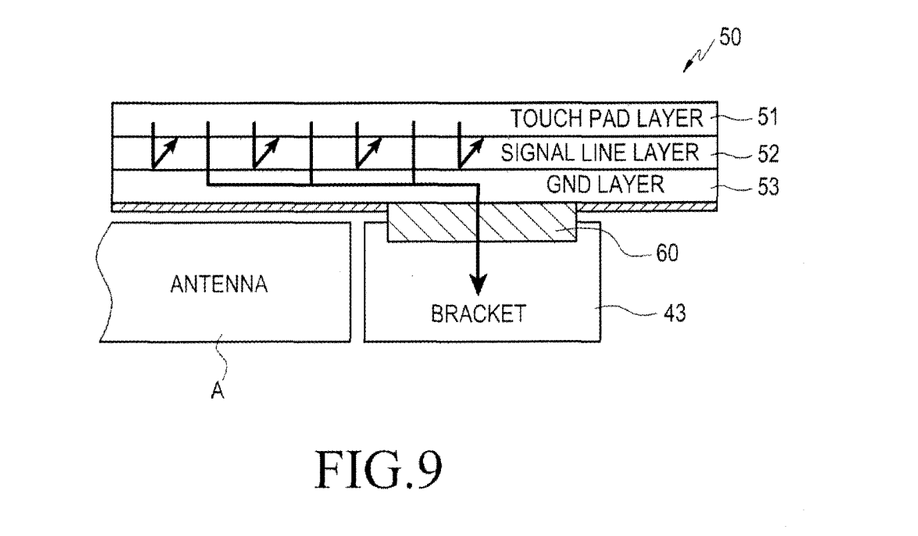
FIG. 9 is a cross-sectional view showing a state where low-frequency noise is blocked in a device according to the present invention.

As shown in FIG. 9, when the display device of the smart phone is in an on state, the touch pad unit 50 is in an operating state at all times for user's key input. Thus, low-frequency noise of an internal clock generated in a touch Integrated Circuit (IC) included in the touch pad unit 50 is introduced to the touch pad layer 51 through the FPCB. To this end, the first ground layer 53 under the touch pad layer 51 blocks the low-frequency noise or the introduced noise flows toward the display bracket (42) through the conductive portion 60 and the extension portion 43. Applicant has discovered that such a path for the low-frequency noise plays an important role in improving the antenna receiving sensitivity.

Table 1 shows improvement of the receiving sensitivity of the LTE antenna A when compared to a conventional case.

TABLE 1

| | Conventional | Touch Pad Unit with 3-Layer Structure | Conductive Structure of First Ground Layer and Display Bracket with Conductive Portion |
|---|---|---|---|
| LTE Antenna Receiving Sensitivity | −82 (dBm) | −88 (dBm) | −90 (dBm) |

Referring to Table 1, it can be seen that when compared to a conventional case, the device according to the present invention obtains an improvement of about 10% in the LTE antenna receiving sensitivity.

As is apparent from the foregoing description, the present invention can improve the receiving sensitivity of the LTE antenna in a low-frequency band of less than 900 MHz.

While the invention has been shown and described with reference to an exemplary embodiment thereof, it will be understood by those skilled in the art that various changes in form and details may be made therein without departing from the scope of the invention as defined by the appended claims and their equivalents.

What is claimed is:

1. A device for improving antenna receiving sensitivity in a portable terminal, comprising:
   an antenna;
   a touch pad unit having a touch pad disposed in the vicinity of the antenna;
   a display bracket;
   an extension portion extending from the display bracket in an integrated form beneath the touch pad unit; and
   a conductive portion disposed between the extension portion of the display bracket and the touch pad, the conductive portion coupling noise introduced from the touch pad unit toward the display bracket and blocking an introduction of the noise to the antenna.

2. The device of claim 1, wherein the display bracket is formed of a magnesium alloy material, and the display bracket comprises the extension portion extending therefrom such that the touch pad is disposed on the extension portion and the conductive portion is disposed between the extension portion and the touch pad.

3. The device of claim 2, wherein the touch pad is laterally disposed outside a periphery of a screen of the portable terminal, and the conductive portion comprises a conductive double-side tape to provide a conductive path between the touch pad unit and the extension portion.

4. The device of claim 3, wherein the touch pad unit comprises:
   a touch pad layer;
   a signal line layer coupled to a bottom surface of the touch pad layer; and
   a first ground layer coupled to a bottom surface of the signal line layer.

5. The device of claim 4, wherein the conductive portion is coupled between the first ground layer and the extension portion to provide a conductive path between the first ground layer and the extension portion.

6. The device of claim 4, wherein a partial area of the bottom surface of the first ground layer is open and contacts the conductive portion, and a remaining area of the bottom surface of the first ground layer comprises a non-conductive layer.

7. The device of claim 6, wherein the non-conductive layer is formed of a Solder Resist (SR) material.

8. The device of claim 4, wherein the entire bottom surface of the first ground layer is open and is electrically connected with the extension portion by means of the conductive portion.

9. The device of claim 4, wherein the signal line layer comprises a second ground layer.

10. The device of claim 1, wherein the antenna is a Long Term Evolution (LTE) antenna operating at a frequency of less than 900 MHz.

11. The device of claim 10, wherein the touch pad unit is disposed near the LTE antenna.

12. A device for improving antenna receiving sensitivity in a portable terminal, comprising:
   an antenna in a low-frequency band of less than 900 MHz mounted on a predetermined position in a body housing; and
   a touch pad unit having a touch pad in the vicinity of the antenna, and having an extended portion through a FPCB (Flexible Printed Circuit Board),
   wherein an extension portion is extended from a display bracket in an integrated form beneath the touch pad unit, and the touch pad unit is grounded to a nearby body in the vicinity of the touch pad by using a conductive portion that blocks noise generated in the touch pad unit.

13. The device of claim 12, wherein the nearby body is formed of a magnesium alloy material and comprises the display bracket coupled to the body housing.

14. The device of claim 13, wherein the conductive portion forms a conductive path between the touch pad unit and the display bracket.

15. The device of claim 14, wherein the display bracket comprises a main portion and the extension portion, the extension portion lying in the same plane as the main portion, the extension portion and the main portion each having a generally rectangular profile, the extension portion being smaller than the main portion and having each of a length and width that is smaller than that of the main portion, and the extension portion extending from the main portion in an integrated form therefrom, wherein the touch pad is disposed on the extension portion.

16. The device of claim 15, wherein the touch pad unit comprises a ground layer on a bottom surface thereof, and the ground layer is electrically connected to the extension portion by means of the conductive portion.

17. The device of claim 12, wherein the touch pad is laterally disposed outside a periphery of a screen of the portable terminal.

* * * * *